United States Patent [19]

Herold et al.

[11] Patent Number: 5,125,107
[45] Date of Patent: Jun. 23, 1992

[54] DIAGNOSTIC MODE FOR A FREQUENCY SYNTHESIZER

[75] Inventors: Barry W. Herold, Boca Raton; Omid Tahernia, Coconut Creek, both of Fla.

[73] Assignee: Motorola, Inc., Schaumburg, Ill.

[21] Appl. No.: 317,875

[22] Filed: Mar. 2, 1989

[51] Int. Cl.$^5$ .......................................... H04B 17/00
[52] U.S. Cl. .............................. 455/226.1; 455/260; 371/22.5
[58] Field of Search .............. 455/182, 183, 192, 260, 455/226; 331/25; 324/73.1 R; 371/22.6, 22.5; 364/550, 571.01

[56] References Cited

U.S. PATENT DOCUMENTS

| | | |
|---|---|---|
| 4,270,178 | 5/1981 | Lillig ............................... 364/579 |
| 4,381,563 | 4/1983 | Grom, Jr. et al. ................ 371/29 |
| 4,701,920 | 10/1987 | Resnick et al. .................. 371/25 |
| 4,788,492 | 11/1988 | Schubert ........................ 324/73 R |
| 4,857,774 | 8/1989 | El-Ayat et al. ................. 371/22.6 |
| 4,893,094 | 1/1990 | Herold et al. ................... 331/1 A |
| 4,918,379 | 4/1990 | Jongepier ...................... 324/73.1 |
| 4,935,707 | 6/1990 | Irwin .............................. 331/16 |
| 4,949,341 | 8/1990 | Lopez et al. .................... 371/25.1 |

Primary Examiner—Reinhard J. Eisenzopf
Assistant Examiner—Chi H. Pham
Attorney, Agent, or Firm—William E. Koch; Vincent B. Ingrassia; Thomas G. Berry

[57] ABSTRACT

A built in test circuit within a frequency synthesizer for use in selective call radio receivers provides a selectable one of a plurality of internal signals as a test signal for diagnosing the frequency synthesizer's output in real time.

12 Claims, 3 Drawing Sheets

019f3ba3-5cb6-48aa-8574-58f44ab66d1c

DIAGNOSTIC MODE FOR A FREQUENCY SYNTHESIZER

FIELD OF THE INVENTION

This invention relates in general to a frequency synthesizer, and more particularly to a frequency synthesizer having a built in test circuit for sampling in real time a number of signals within the frequency synthesizer for diagnosing the output of the frequency synthesizer.

BACKGROUND OF THE INVENTION

Typically, a frequency synthesizer comprises a first divide-by counter providing a reference signal to a phase detector in response to an oscillator signal from a crystal controlled reference oscillator. The phase detector provide a filtered d.c. voltage to a voltage controlled oscillator. A second divide-by counter provides a feedback signal from the output of the voltage controlled oscillator to the phase detector. This circuit arrangement is commonly referred to as a phase locked loop. Frequency synthesizers provide virtually an unlimited number of discrete frequencies directly related to the frequency of the reference oscillator for mixing with the carrier frequency within a selective call radio receiver. However, a disadvantage of known frequency synthesizers is that there is no known method of testing signals within the synthesizer in real time for diagnosing a faulty output signal.

Thus, what is needed is a frequency synthesizer having a built in test circuit for sampling in real time a number of signals within the frequency synthesizer for diagnosing the output of the frequency synthesizer.

SUMMARY OF THE INVENTION

Accordingly, it is an object of the present invention to provide an improved frequency synthesizer.

Another object of the present invention is to provide a built in test system for a frequency synthesizer within a selective call radio receiver.

In carrying out the above and other objects of the invention in one form, there is provided a phase locked loop comprising a first counter providing a first signal having a first frequency in response to a reference signal having a reference frequency and a phase detector providing second and third signals in response to the first signal and a fourth signal. A sink source float provides a fifth signal in response to the second and third signals and an oscillator provides an output signal in response to the fifth signal. A second counter provides the fourth signal in response to the output signal and a test controller selectively provides selected ones of the reference, first, second, third, fourth, and fifth signals as a test output.

The above and other objects, features, and advantages of the present invention will be better understood from the following detailed description taken in conjunction with the accompanying drawings.

DETAILED DESCRIPTION OF THE INVENTION

Figure 1:
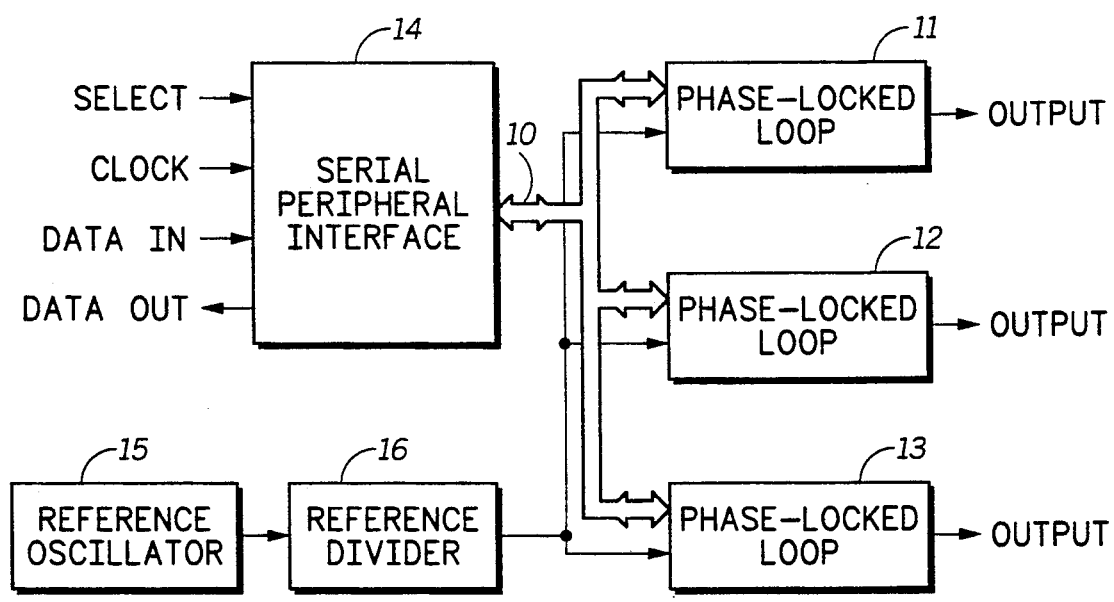
FIG. 1 is a block diagram of a plurality of phase locked loops coupled to a serial peripheral interface.

Referring to FIG. 1, phase locked loops 11, 12, and 13 each serve as a frequency synthesizer for a selective call radio receiver such as a pager. Although three phase locked loops are shown, the invention would work equally as well with any number of phase locked loops. A serial peripheral interface 14 has three inputs comprising SELECT, CLOCK, and DATA IN, and one output DATA OUT and is coupled by the bus 10 to the phase locked loops 11, 12, and 13 for transmitting these signals therebetween. A crystal controlled reference oscillator 15 provides an oscillator frequency to a reference divider 16 for providing a reference frequency $F_{REF}$ to each of the phase-locked loops 11, 12, and 13.

In the normal data operation, the select signal SELECT enables the system and the clock signal CLOCK clocks in the input signal DATA IN. The input signal DATA IN comprises an eight bit control word for selecting one of the phase locked loops 11, 12, and 13 and programming the selected loop for a desired frequency. The control word is followed by four eight bit data words transmitting data to the selected loop. Only one reference oscillator 15 is required for a plurality of phase locked loops 11, 12, and 13.

Figure 2:
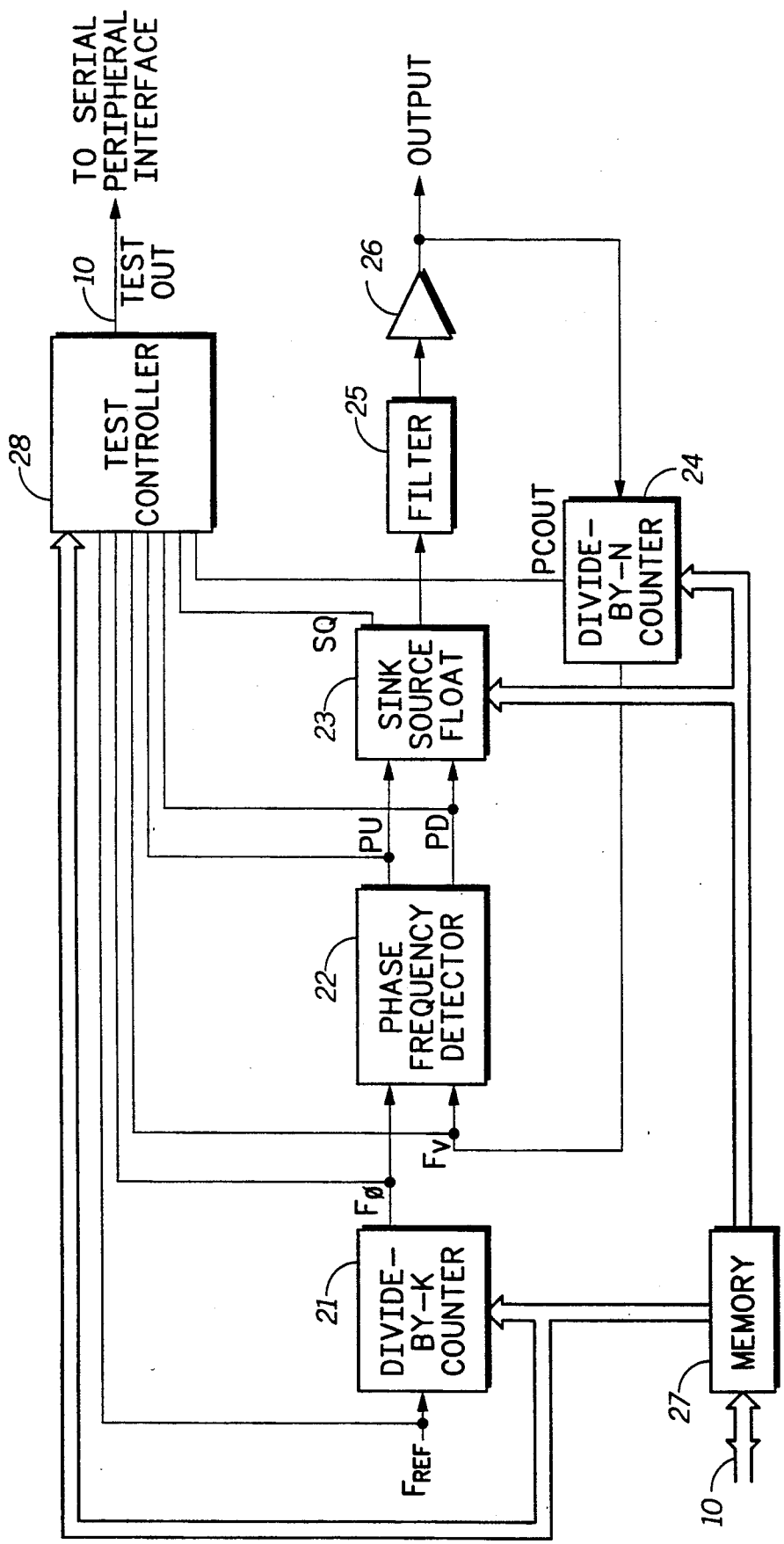
FIG. 2 is a block diagram of a phase locked loop in accordance with the present invention.

Referring to FIG. 2, each of the phase-locked loops 11, 12, and 13 comprises a divide-by-K counter 21 providing an output $F_\phi$, where K is a number programmed by the data control word that selects the desired loop reference frequency. A phase frequency detector 22 provides outputs pump up PU and pump down PD signals to the sink source float 23 indicative of the phase/frequency relation between inputs from the divide-by-K counter 21, signal $F_{REF}$, and the sink source float 23 by the feedback loop, signal $F_V$, from the divide-by-N counter 24. The pump up PU and pump down PD signals are digital signals triggered by the loop reference frequency $F_\phi$ and the signal $F_V$, respectively, that dictate pulses representing the output voltage from the sink source float 23. The divided-by-N counter 24 provides the signal $F_V$ for matching the signal $F_\phi$ in frequency and phase. The filter 25 provides a filtered DC control voltage to a voltage controlled oscillator VCO 26. The memory 27 comprises a plurality of registers for clocking data in from the serial peripheral interface 14 to both the divide-by-K and divide-by-N counters 21 and 24.

In accordance with the present invention, the test controller 28 allows for the monitoring of critical signals within each phase locked loop through a single output line TEST OUT, which is routed to the serial peripheral interface 14 and provided as the output DATA OUT during the test mode. Once the test mode is selected for a particular loop, one of six internal signals may be monitored in real time through three programming bits. During the diagnostic mode, a control word and a single data word are clocked in as the input signal DATA IN. The control word enables the test mode, selects one of the phase locked loops 11, 12, or 13, and selects the desired signal $F_{REF}$, $F_\phi$, $F_V$, PU, PD, PCOUT, SQ, and the output DATA from the plurality of flip-flops 31 as output TEST OUT.

Figure 3:
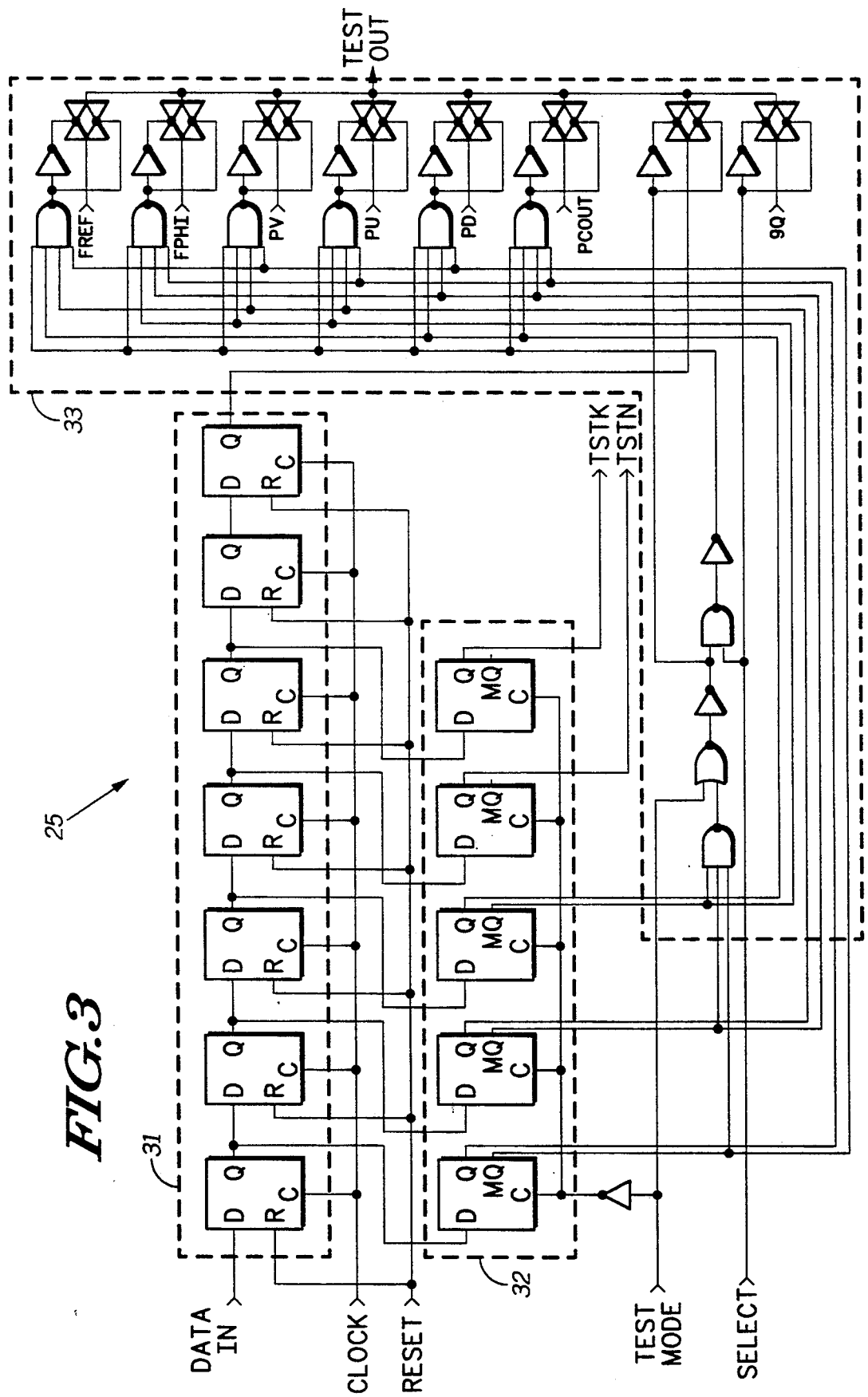
FIG. 3 is a block diagram of a test controller within each of the phase-locked loops.

Referring to FIG. 3, the test controller 28 comprises a plurality of flip-flops 31 (registers) coupled in series for series for clocking the eight bit words through the test controller 28. A plurality of flip-flops 32 (latches) are coupled in series for latching the eight bit word and providing signals TSTK and TSTN to the divided-by-K and divided-by-N counters, respectively, for selecting additional signals within the respective counter. The multiplexer 33 provides one of the signals $F_{REF}$, $F_\phi$, $F_V$, PU, PD, PCOUT, SQ, and the output DATA from the plurality of flip-flops 31 in response to the eight bit test word. Signal PCOUT is, for example, a signal internal to the divide-by-N counter 24 that provides an indication of the functionality of the counter 24. Signal SQ is an output signal from the sink source float 23 that comprises the input signal DATA IN as it clocks through the divide-by-K counter 21, the divide-by-N counter 24, and the sink source float 23.

One skilled in the art would be able to set up any number of methods to control the test selection.

By now it should be appreciated that there has been provided a frequency synthesizer having a built in test circuit for sampling in real time a number of signals within the frequency synthesizer for diagnosing the output of the frequency synthesizer.

We claim:

1. A monolithically integrated phase locked loop comprising:

in normal operation:
    a first counter providing a first signal having a first frequency in response to a reference signal having a reference frequency;
    a phase detector providing second and third signals in response to the first signal and a fourth signal;
    a sink source float providing a fifth signal in response to the second and third signals;
    an oscillator providing an output signal in response to the fifth signal;
    a second counter providing the fourth signal in response to the output signal; and in a test mode:
    a test controller coupled to said first and second counters, said phase detector, and said sink source float for selectively providing selected ones of the reference, first, second, third, fourth, and fifth signals in real time as a test output, the test mode having substantially no effect on the normal operation.

2. The phase locked loop in accordance with claim 1 wherein said test controller comprises a multiplexer coupled to said first counter, said phase detector, said sink source float, and said second counter, said multiplexer for providing the test output in response to a test word of a digital input signal.

3. The phase locked loop in accordance with claim 2 wherein said test controller further comprises a plurality of registers coupled in series and coupled to said multiplexer and receiving the digital input signal for providing one or more data words of the digital input signal as an additional one of the selected signals as the test output.

4. The phase locked loop in accordance with claim 3 wherein said test controller further comprises a plurality of latches coupled between said plurality of registers and said multiplexer, each of said latches receiving an output of said one of said registers for providing selected bits within the digital input signal as one of or more control signals for selecting yet another internal signal as the test output.

5. A monolithically integrated frequency synthesizer system having one or more phase locked loops, each phase locked loop generating an output signal having a selectable one of a plurality of frequencies, each of said phase locked loops comprising circuitry having a plurality of signals therein, comprising:

first means for providing a first signal having a reference frequency;

second means for receiving a digital input signal having a plurality of bits and providing the digital input signal bits at a specified rate in response to a clock pulse, each of said phase-locked loops coupled to said first and second means for generating, in normal operation, the output signal in response to the clocked digital input signal and the reference signal; and a plurality of third means, one each of said third means coupled to one each of said plurality of phase-locked loops for selectively providing in a test mode and in real time a selected one of said plurality of signals internal to each of said phase locked loops for diagnosing the output signal, the test mode having substantially no effect on the normal operation.

6. The digital frequency synthesizer according to claim 5 wherein each of said third means comprises a multiplexer coupled to at least one of said plurality of phase-locked loops for providing the selected one of the plurality of signals within the at least one of said phase locked loops as the output signal in response to a test word of the digital input signal therefrom.

7. The digital frequency synthesizer according to claim 6 wherein each of said third means further comprises a plurality of registers coupled in series and coupled to said multiplexer and receiving the digital input signal for providing one or more data words of the digital input signal as an additional one of the selected signals as the test output.

8. The phase locked loop in accordance with claim 7 wherein each of said third means further comprises a plurality of latches coupled between said plurality of registers and said multiplexer, each of said latches receiving an output of one of said registers for providing selected bits within the digital input signal as one or more control signals for selecting yet another internal signal as the test output.

9. A monolithically integrated digital frequency synthesizer system for generating one or more channel frequencies in a radio call receiver, comprising:

means coupled for receiving and clocking a digital input signal, the digital input signal comprising a control word and one or more data words;

a reference oscillator providing a reference signal having a reference frequency;

one or more phase locked loops, each coupled to said means and said reference oscillator for receiving the clocked digital input signal and the reference signal, respectively, wherein, in normal operation, the control word selects said one or more phase locked loops and programs each of said selected phase locked loops for providing one of the channel frequencies from each of said selected phase locked loops, each of said phase locked loops comprising circuitry having a plurality of signals therein; and a plurality of test circuits, one each coupled to one of said phase locked loops, for selectively providing one of said plurality of signals internal to said respective phase locked loop, in a test mode, as a digital output in real time in response to the control word of the digital input signal, the providing of the digital output having substantially no effect on the normal operation of the one or more phase locked loops.

10. The digital frequency synthesizer system according to claim 9 wherein each of said test circuits comprises a multiplexer coupled to at least one of said plurality of phase-locked loops for providing the selected one of the plurality of signals within the at least one of said phase locked loops as the output signal in response to a test word of the digital input signal therefrom.

11. The digital frequency synthesizer system according to claim 10 wherein each of said test circuits further comprises a plurality of registers coupled in series and coupled to said multiplexer and receiving the digital input signal for providing one or more data words of the digital input signal as an additional one of the selected signals as the test output.

12. The digital frequency synthesizer system according to claim 10 wherein each of said test circuits further comprises a plurality of latches coupled between said plurality of registers and said multiplexer, each of said latches receiving an output of one of said registers for providing selected bits within the digital input signal as one or more control signals for selecting yet another internal signal as the test output.

* * * * *